United States Patent [19]

Mori et al.

[11] 4,274,529

[45] Jun. 23, 1981

[54] FEED-RETRIEVE DEVICE FOR SHEET BOARDS

[75] Inventors: Kazuhiro Mori; Yoshihiko Misawa, both of Katano; Kiyoshi Mayahara, Kadoma; Shigeru Araki, Katano, all of Japan

[73] Assignee: Matsushita Electric Industrial Co., Ltd., Kadoma, Japan

[21] Appl. No.: 96,694

[22] Filed: Nov. 23, 1979

Related U.S. Application Data

[63] Continuation of Ser. No. 861,192, Dec. 14, 1977.

[30] Foreign Application Priority Data

Dec. 20, 1976 [JP] Japan .................................. 51-153994

[51] Int. Cl.³ ............................................ B65G 47/00
[52] U.S. Cl. .................................... 198/339; 198/470;
 198/862
[58] Field of Search ............... 198/341, 577, 467, 470,
 198/857, 339, 505, 810, 631, 862, 863, 809, 607,
 572, 624, 835; 29/741, 759; 72/424, 405;
 414/130, 131; 53/524

[56] References Cited

U.S. PATENT DOCUMENTS

| 1,776,419 | 9/1930 | Dodge | 198/835 X |
| 3,051,289 | 8/1962 | Horsford | 198/572 |
| 3,626,652 | 12/1971 | Langenscheidt | 53/524 X |

FOREIGN PATENT DOCUMENTS 157626 4/1964 U.S.S.R. .................................. 198/624

Primary Examiner—Robert B. Reeves
Assistant Examiner—Douglas D. Watts
Attorney, Agent, or Firm—Cushman, Darby & Cushman

[57] ABSTRACT

This invention relates to a device for feeding or retrieving sheet boards, to be used in an apparatus for planting various electric parts or materials such as capacitors, resistors, connecting wires, terminal pins, etc. into sheet boards such as printed circuit boards. The device is designed that said sheet boards are automatically brought to a processing position for planting said parts or materials thereto, or after such processing there, such processed sheet boards are automatically retrieved from said processing position. This invention especially strives to keep said sheet boards free from damage or loss of planted parts or materials when feeding and retrieving them and to permit said device to treat different sizes of sheet boards, as well, at an evenly efficient speed.

7 Claims, 11 Drawing Figures

FEED-RETRIEVE DEVICE FOR SHEET BOARDS

This is a continuation, of application Ser. No. 861,192 filed Dec. 14, 1977.

BACKGROUND OF THE INVENTION

1. Field Technology

This invention relates to a feed or retrieve device for use in apparatus for automatic mounting of electric parts on a sheet board.

This invention provides a particularly high practical value as a feeding or retrieving device having a highly efficient automatic mechanism for feeding and retrieving sheet boards such as, for instance, printed circuit boards, in an apparatus for automatically and sequentially inserting lead wires of electric parts such as, for instance, ceramic capacitors, film capacitors, electrolytic capacitors, various types of resistors etc. into specified holes on the printed circuit boards, etc.

2. Prior Art

An automatic feeding and retrieving device of this kind in the prior art is shown in FIG. 1, wherein a body 1 of the device comes down to separate with its claws 2 and 2' a stock of printed circuit boards stacked at a feeding part A and to pick therefrom the boards one by one and, holding one board between the claws, goes upward and then sideways to carry said board to a processing part B, where said body comes down again and releases said printed circuit board. Then said body 1 goes upward and returns sideways above the feeding part A. This movement is sequentially repeated. Synchronously with the movement of the claws 2 and 2' during this operation, claws 3 and 3' retrieve said printed circuit board already processed from the processing position and carry it to a box 4 to release thereinto. Such repetition was the automatic feeding and retrieving procedure of the prior art. Numerals 5 and 6 are cylinders for carrying sideways and for up-and-down movement, respectively.

In this prior art device, the structural construction is necessarily complicated because of the mechanism of separating, picking, holding, carrying and releasing the printed circuit boards, and also there is a danger of the boards being scratched or scraped off when gripped by the claws. Moreover, there are such shortcomings that when each printed circuit board is, after processing, dropped into the retrieve case 4, installed electric parts are liable to loosening or shaking-off, that a cylinder having a working stroke to cover its lateral movement as well as an open space sufficient therefor are required, that it is difficult to place around the processing part B such processing devices as an insertion head for planting parts onto the printed circuit boards at the processing place B since the body 1 of the device travels over the processing place B, and like inconveniences.

There is another type of prior art (as seen in U.S. Pat. No. 3,364,723) which is designed to suck up and carry the sheet board with a sucking disk. In this case, although there is no danger for the sheet board to be damaged while being lifted, it is difficult for sheet boards already planted with electric parts or materials to be stacked up at the feeding part for automatic sequential feeding. There is also the same inconvenience of placing around the processing part B such a large device as an insertion head like in the preceding case.

There is still another type of prior art (as seen in U.S. Pat. No. 3,789,483) designed to feed sheet boards to the processing part by a rotary unit. In this device however, the mechanism for rotating with sheet boards on it is complicated and is not suitable for speeding up the insertion of electric parts and also not suitable as a feeding and retrieving device for sequential combination with two or more inserting machines.

SUMMARY OF THE INVENTION

This invention purposes to perform automatically and highly efficiently the work of feeding and retrieving sheet boards to and from an apparatus designed to process, assemble or fix parts to sheet boards.

This invention further purposes to provide a device for feeding and retrieving sheet boards, which is effective for speeding up the insertion of parts.

Another object of this invention is to provide a feeding and retrieving device capable of feeding and retrieving sheet boards to which parts are already assembled, without damaging the parts or sheet boards or without scraping off or shaking-off the parts already installed.

A further object of this invention is to provide a device capable of making sequential combinations with two or more similar or different kinds of inserting machines.

A further object of this invention is to provide a sheet board feeding and retrieving device of simple construction dispensing with a mechanism for pinching and releasing sheet boards.

Still another object of this invention is to provide a device having wider uses and capable of easily changing its rail width when the width of sheet boards to be fed varies.

DETAILED DESCRIPTION OF THE INVENTION

A preferred example of a feed-retrieve device of the present invention is elucidated hereinafter referring to FIGS. 2 to 11.

Figure 1:
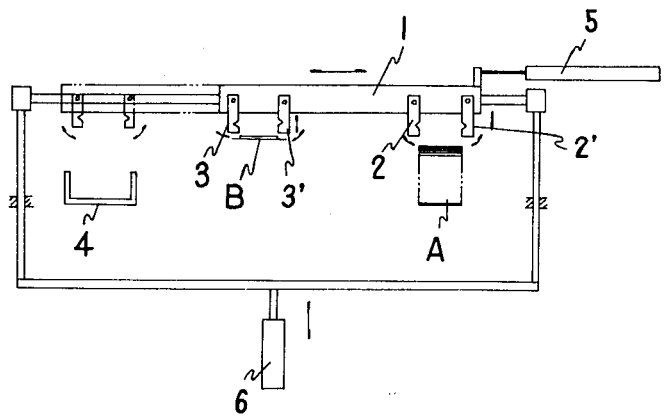
FIG. 1 is a front view of a sheet board feed-retrieve device of a prior art.
Figure 2:
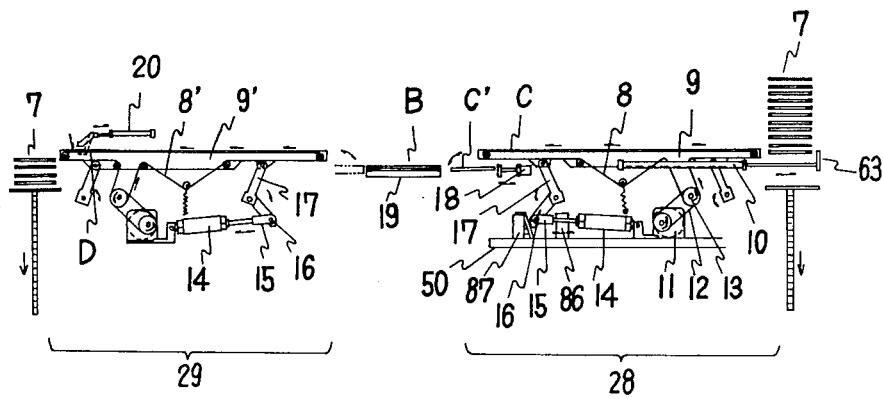
FIG. 2 is a front view of the principal part of a sheet board feed-retrieve device in one example of this invention.
Figure 3:
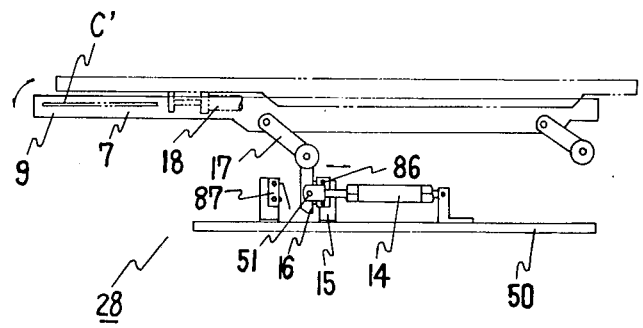
FIG. 3 is a partial enlarged front view of a feeding device.

In FIG. 2 and FIG. 3, sheet boards, for example, printed circuit boards 7 in a feeding pile on the right-hand are fed, one by one, to a position C, guided by their side edges on a pair of parallel rails 9, 9. At least one rail 9 has a built-in belt conveyer running thereon.

A cylinder 10 has a hook 63 which pushes and feeds the lowermost sheet board 7 of the feeding pile leftward to the belt conveyor 8. A motor 11 drives the belt conveyer 8 through a timing belt 12 and a pulley 13. A cylinder 14 drives the rails 9 left-downward by means of linkage of block 15, arm 16 and lever 17. A pushing cylinder 18 pushes the sheet board, which has been conveyed from the position C to a left-down position C', to the processing position and into a positioner 19.

The operation of the abovementioned feeding device 28 is such that, when one of the sheet boards is fed into the positioner 19 by the operation of the pushing cylinder 18, a previous sheet board, which has been processed, i.e. provided with various inserted electric parts in the positioner 19 until that time, is pushed leftward at its rear end (right end) by the front end (left end) of said one of the sheet boards. Thus the previous sheet board is pushed leftward out of the positioner 19.

The sheet board 7 thus pushed and retrieved from the positioner 19 is then conveyed onto the right end of the rail 9' of the retrieve device then conveyed to the position D by means of the belt 8' on the rail 9', and then is pushed by the cylinder 20 into the finished pile 7 in the retrieving device 29. The abovementioned feeding and retrieving of the sheet boards are made sequentially at a specified frequency.

Figure 4:
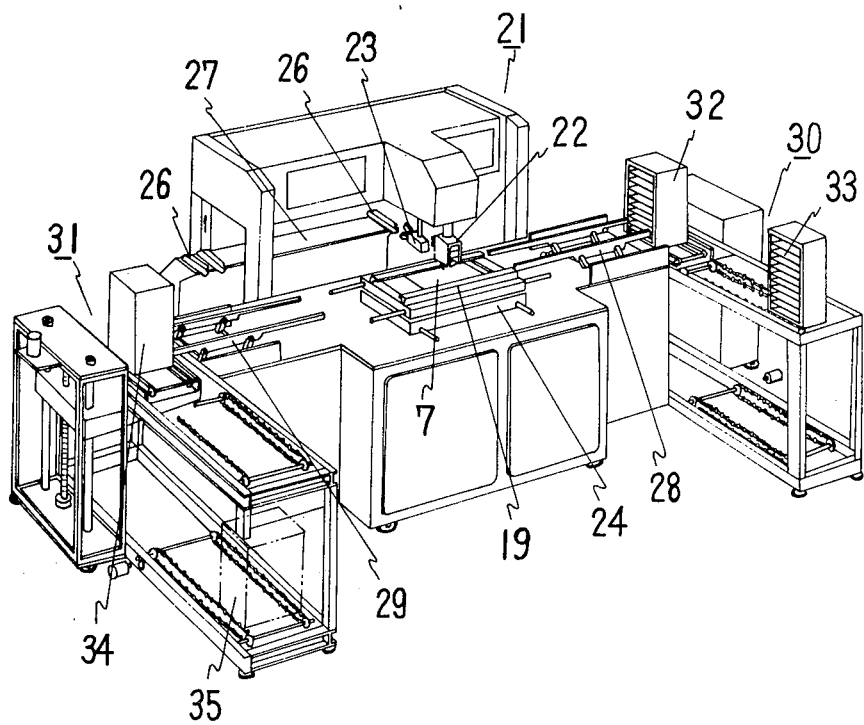
FIG. 4 is a perspective view of a parts-inserting machine provided with a feeding and retrieving device embodying the invention.

The overall construction of the electric parts-inserting machine is shown in FIG. 4.

The inserting machine comprises an inserting head 22, a cutter 23 which cuts the holding tape of the electric parts preliminary to each insertion, a table 24 holding the positioner 19 and a parts feeder 27 enclosing a number of parts cassettes 26. On the righthand and lefthand of the table 24 and the positioner 19 are disposed the feeding device 28 and the retrieving device 29, respectively. Furthermore, on the righthand of the feeding device 28 is disposed a sheet board feeder 30 comprising sheet board cassettes 32, 33, and on the lefthand of the retrieving device 29 is disposed a sheet board retriever 31 comprising sheet board cassettes 34, 35.

Figure 5:
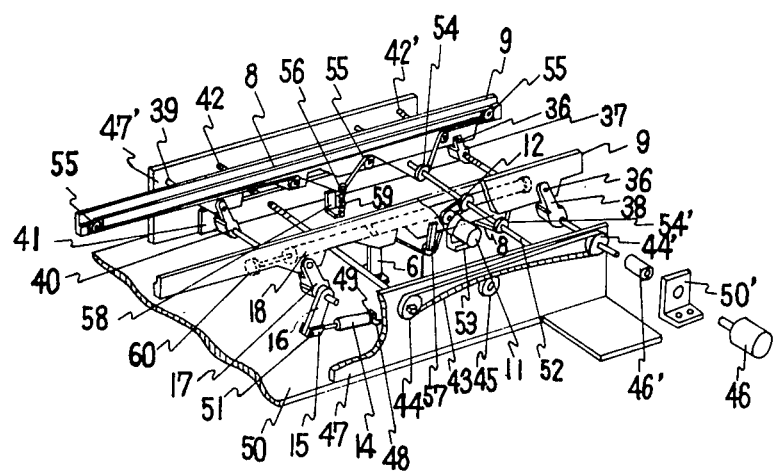
FIG. 5 is an enlarged perspective view of a feeding part of said device.
Figure 6:
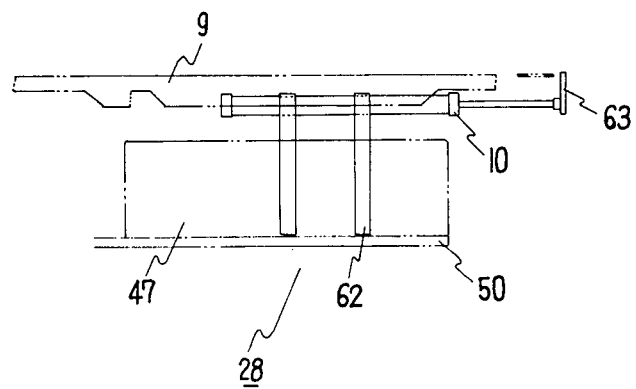
FIG. 6 is an abridged front view of a part of the feeding cylinder of the device.
Figure 7:
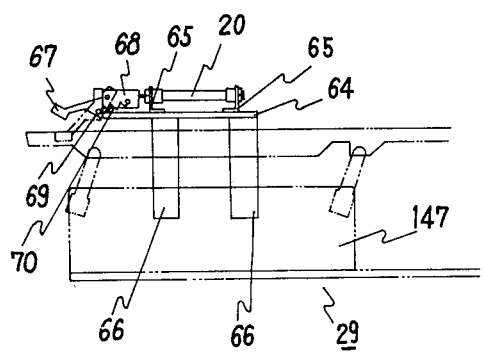
FIG. 7 is an abridged front view of a part of an inserting cylinder.

Details of the feeding device 28 are shown in FIG. 5. The rails 9, 9 are supported on levers 37, 38 and 17, 40 by connecting pins 36, 36. The levers 37 and 40 are pivotted on a guide plate 41. Bolts 42, 42' are rotatably pivotted by holes on a frames 47, 47' fixed on a base plate 50. Threaded parts of the bolts 42, 42' are engaging through threaded holes on the guide plate 41. Pulleys 44 and 44' are fixed on the bolts 42 and 42' respectively. A motor 46 connected by a bracket to the bolt 42' drives both bolts 42 and 42' simultaneously by means of a linkage with the timing belt 43. A tension pulley 45 is provided to give a suitable tension to the timing belt 43. By electrifying the motor 46, the bolts 42 and 42' are driven, and move the guide plate 41, thereby varying the distance between the rails 9, 9. A cylinder 14 is rotatably supported by a bracket 48 and pin 49 on the base plate 50, and a moving end of the cylinder 14 is pivotted to an arm 16 through a block 15. A belt motor 11 drives a timing belt 12, which drives the pulley 90, hence other pulleys 54, 54' fixed on the same shaft 52. Belts 8, 8 are guided by pulleys 55, 55 and tension pulley 56, run on the rails 9, 9 and are driven by the driving pulley 54, 54'. The tension pulley 56 is pivotted on a tension arm 57, and gives the belt 8 a tension by means of a spring 59. A pushing cylinder 18 comprising a pusher 60 for pushing out the sheet board to the positioner 19 is fixed to the base plate 50 via a bracket 61. A scraping cylinder 10 comprising a scraping hook 63 for scraping the sheet board from the pile of the feeding device 28 onto the belts 8, 8 on the rails 9, 9 is fixed to the base plate 50 via a bracket 62.

The retrieving device 29 has similar construction to the feeding device 28 but lacks a scraping cylinder like the one 10 in the feeding device, as well as a pushing cylinder like the one 18.

A retrieving cylinder 20 (FIG. 2 & FIG. 7) for pushing out the sheet board from the belt 8' on the rail 9' of the retrieving device 29 is fixed to a base plate 64 via a bracket 65. The base plate 65 is fixed to the frame 147 via plates 66, 66. A pusher 67 is pivotted on a block 68 fixed to the moving end of the retrieving cylinder 20 and a tension spring 70 is provided between a pin 69 on the pusher and a pin on the block 68.

When the scraping cylinder 10 is actuated, a lowest sheet board in the feeding pile 7 (FIG. 2) in a feeding cassette 32 (FIG. 4) in the feeder 30 is scraped out by the scraper 63 onto the belt 8, 8 on the rail 9, 9 of the feeding device 28. Then the belt 8, 8 conveys the sheet board to the leftmost part C on the rail 9, 9. Then a limit switch 82 detects the arrival of the sheet board at the position C, and causes the cylinder 14 to actuate and pull the block 15 rightward, hence actuating the levers 17 leftward, thereby moving the rails 9, 9 left-downward, so that the position C comes down to the position C' (FIG. 2, FIG. 3), where the rails 9, 9 and the receiving face of the positioner 19 are continuous to each other. When the left ends of the rails 9, 9 reach the preset position, another limit switch 86 detects the reaching and actuates the pushing cylinder 18 to push out the sheet board from the position C' to a positioner 19 on the position B. The inserting head (FIG. 4) then inserts the necessary number of electric parts into specified parts of the sheet board on the positioner 19. After pushing the sheet board out to the positioner 19, the cylinder 14 restores to push the block 15 leftward thereby lifting the rails 9, 9 up and rightward. Accordingly, block 15 actuates a limit switch 87 which hence actuates the scraping cylinder 10 to work again. Consequently, another sheet board is pulled leftward on the rails 9, 9.

The sheet board with the inserted electric parts is then pushed leftward from the positioner 19 onto the rails 9, 9' of retrieving device by the left end of next sheet board which is incoming into the positioner 19. Then, the rails 9, 9' of the retrieving device 29 are lifted and brought leftward as shown in FIG. 2, and the belt 8, 8' on the rails 9, 9' conveys the sheet board to the left end of the retrieving device 29. Then, the retrieving cylinder 20 works to actuate the pusher 67 to push the sheet board out into the finished pile 7 in the cassette 34 of the retriever 31.

As elucidated in the above description, the feed-retrieve device according to the present invention operates to smoothly feed the sheet board into the position 19 and to smoothly retrieve it from there without scratching or undesirable shock. Moreover, since the moving of the sheet board in the device is linear, two or more of the devices can be combined sequentially in a line. Furthermore, since the feeding device 28 and the retrieving device 29 are isolated from each other as separate devices, and since the rails 9, 9 and rails 9', 9' move to connect to the processing part and to depart from it, wide space on the processing part can be freely used by the parts-inserting head 22 and related devices. Accordingly, the parts-inserting head 22 can be located very close to the positioner 19, thereby enabling one to achieve high speed parts-inserting. Further, by means of the motor 46, the distance between the rails 9 and 9 can be speedily varied when the size of the sheet boards to be handled is changed.

FIG. 8 to FIG. 11 show details of various parts of the abovementioned device.

Figure 8:
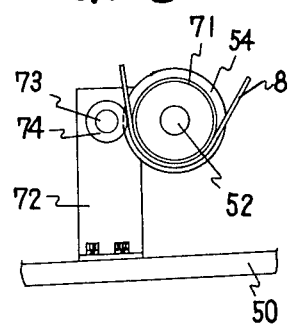
FIG. 8 is a front view of a driving pulley part of a belt in one example of this invention.

FIG. 8 shows the pulley 54 and relevant parts to drive the belt 8 without slip. The pulley 54 has a rubber tire 71 for securing good friction. The belt 8 is pushed on the rubber tire 71 by means of a rubber roller 74 rotatably pivotted to a bracket 72 by a shaft pin 73. Because the belt is pinched by the rubber tire 71 of the pulley 54 and rubber roller 74, the belt does not slip from the tire 71, thereby assuring precise speed.

Figure 9:
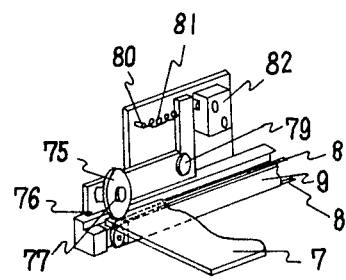
FIG. 9 is an enlarged perspective view of a sheet board stop device in further example of this invention.

FIG. 9 shows the limit switch 82 and relevant parts to detect that a sheet board reaches a specified position. A small wheel 75 is pivotted on an L-shaped arm 76 by a shaft pin 77. The L-shaped arm 76 is pivotted by a pin 79 on a plate fixed to the end tip of the rail 9. A tension spring 81 is provided to keep the small wheel 75 pressed down on the rail 9. The switch 82 is disposed so as to be actuated by a pressing of its actuator by a free end of the L-shaped arm 76. When a sheet board is conveyed by on the rail 9 to its left end part, the small wheel 75 is raised by the thickness of the sheet board 7 against the pressing force induced by the spring 81. By the raising of the small wheel 75, the other end of the L-shaped arm 76 pushes the actuator of the limit switch 82, accordingly to switch the circuit to stop the running of the belts 8,8. Therefore, the sheet board 7 stops at the specified position C. Since the small wheel 75 presses the sheet board on the rail 9, it serves as a guide to smoothly and safely convey the sheet board leftward to the positioner 19 without derailment or the like accident.

Figure 10:
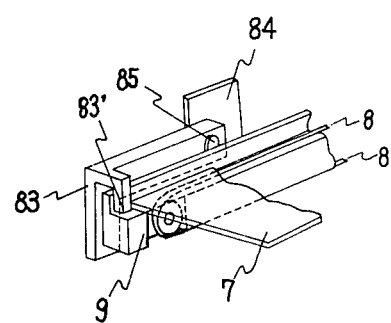
FIG. 10 and FIG. 11 are enlarged perspective views of an example of a sheet board stop device, each showing different states.
Figure 11:
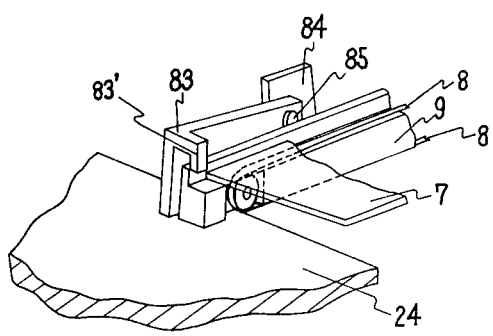

FIG. 10 and FIG. 11 show a modified construction to transfer the sheet board from the rail 9 of the feeding device 28 to the positioner with a precise timing. In FIGS. 10 and 11, a stopper 83 is pivotted by a pin 85 on a frame 84. When the rail 9 is lowered in the aforementioned way, the lower face of the free end of the stopper 83 contacts the upper face of the table 24 as shown in FIG. 11, and therefore the free end of the stopper 83 is raised relatively to the rail 9, thereby disengaging the stopping hook 83' from the front end of the sheet board 7, allowing the sheet board to be sent leftward. At this moment, the pushing cylinder 18 pushes the sheet board onto the positioner.

As elucidated by the abovementioned description referring to the preferred embodiments, the feed-retrieve device according to the present invention can safely and reliably feed and retrieve even sheet boards already having electric parts installed thereon, since the device of this invention only slidingly conveys the sheet board on the rails and to or from the upper face of the positioner, not clamping or dropping them.

Furthermore, as has been elucidated, more than two of the feeding or retrieving devices embodying the present invention can be arranged in a line to perform complex inserting of many parts.

Further, since there is no clamping means to clamp the sheet board, the mechanism of the device is simplified.

Besides, since the feeding device and the retrieving device are isolated from each other, the space over and around the inserting head can be made wide, thereby enabling location of the inserting head at a proximity to the positioner.

Moreover, when the size of the sheet board to be handled is changed, the rail spacing can be quickly changed by means of the motor.

What we claim is:

1. A feed-retrieve device for sheet boards comprising:
a pair of parallel rails for holding said sheet boards in a horizontal position and guiding side edges of said sheet boards thereon in a horizontal direction,
at least one belt conveyor which runs along said rails,
a rigid table face having a processing position,
a sheet board supporting means having a supporting face, and
a means to move said rails together with said at least one belt conveyer both in said horizontal direction and in a vertical direction between a first position where said rails are apart at least in said horizontal direction from said processing position on said rigid table face to process said sheet boards and a second position where said rails are close to and at a level that is flush with said supporting face of said sheet board supporting means.

2. A feed-retrieve device for sheet boards comprising:
a pair of parallel rails for holding said sheet boards in a horizontal position and guiding side edges of said sheet boards thereon in a horizontal direction,
at least one belt conveyer which runs along said rails,
a rigid table face having a processing position,
a sheet board supporting means having an upper supporting face,
a means to move said rails together with said at least one belt conveyer both in said horizontal direction and in a vertical direction between a first position where said rails are apart at least in said horizontal direction from said processing position on said rigid table face to process said sheet boards and a second position where said rails are at a level that is flush with said upper supporting face of said sheet board supporting means,
a first detecting means which detects that one of said sheet boards has come to a specified position, and
a second detecting means which detects that said rails have come to said second position.

3. A feed-retrieve device for sheet boards of claim 1 which further comprises a threaded bolt means, a means to support one of said rails having at least one threaded hole engaging said threaded bolt means and a motor to drive said threaded bolt means.

4. A feed-retrieve device for sheet boards comprising:
a pair of parallel rails for holding said sheet boards in a horizontal position and guiding side edges of said sheet boards thereon in a horizontal direction,
at least one belt conveyer which runs along said rails,
a rigid table face having a processing position,
a sheet board supporting means having a supporting face, and
a means for moving said rails together with said at least one belt conveyer both in said horizontal direction and in a vertical direction between a first position where a working head is in a proximity position to said sheet board on said rigid table face when said rails come to said first position and a second position where said working head is in an apart position from said rigid table face when said rails come to said second position.

5. A feed-retrieve device for sheet boards comprising:
a pair of parallel rails for holding said sheet boards in a horizontal position and guiding side edges of said sheet boards thereon in a horizontal direction, at least one belt conveyer which runs along said rails,
a rigid table face having a processing position,
a sheet board supporting means having a supporting face,
a means for moving said rails together with said at least one belt coneyer both in said horizontal direction and in a vertical direction between a first position where a working head is in a proximity position to said sheet boards on said rigid table face when said rails come to said first position and a second position where said working head is in an apart position from said rigid table face when said rails come to said second position,
a first detecting means which detects that one of said sheet boards has come to a predetermined position, and
a second detecting means which detects that said rails have come to said second position.

6. A feed-retrieve device for sheet boards comprising:
a pair of parallel rails for holding said sheet boards in a horizontal position and guiding side edges of said sheet boards thereon in a horizontal direction,
at least one belt conveyer which runs along said rails,
a rigid table face having a processing position,
a positioner having a sheet board supporting means having a supporting face, and
a means for moving said rails together with said at least one belt conveyor both in said horizontal direction and in a vertical direction between a first position where a working head is in a proximity position to said sheet board on said sheet board supporting means of said positioner and a second position where said rails are close to and at a level that is flush with said supporting face of said sheet board supporting means of said positioner.

7. A feed-retrieve device for sheet boards comprising:
a pair of parallel rails for holding said sheet boards in a horizontal position and guiding side edges of said sheet boards thereon in a horizontal direction,
at least one belt conveyor which runs along said rails,
a rigid table face having a processing position,
a positioner having a sheet board supporting means having a supporting face,
a means for moving said rails together with said at least one belt conveyor both in said horizontal direction and in a vertical direction between a first position where a working head is in a proximity position to said sheet boards on said sheet board supporting means and a second position wherein said rails are close to and at a level that is flush with said supporting face of said positioner,
a first detecting means which detects that one of said sheet boards has come to a predetermined position, and
a second detecting means which detects that said rails have come to said second position.

* * * * *